United States Patent
Lee et al.

(10) Patent No.: US 7,342,791 B2
(45) Date of Patent: Mar. 11, 2008

(54) LOCKING DEVICE FOR HEAT SINK

(75) Inventors: Hsieh-Kun Lee, Tu-Cheng (TW); Cui-Jun Lu, Shenzhen (CN); Ling-Bo Cao, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 178 days.

(21) Appl. No.: 11/216,700

(22) Filed: Aug. 31, 2005

(65) Prior Publication Data

US 2006/0056159 A1    Mar. 16, 2006

(30) Foreign Application Priority Data

Sep. 10, 2004 (CN) .................. 2004 2 0093960

(51) Int. Cl.
*H05K 7/20* (2006.01)

(52) U.S. Cl. .............. 361/704; 165/80.3; 165/185; 257/718; 257/719; 361/710; 361/719

(58) Field of Classification Search ........ 257/718–719; 361/710, 719, 700
See application file for complete search history.

(56) References Cited

U.S. PATENT DOCUMENTS

| 5,504,652 | A | * | 4/1996 | Foster et al. ............... 361/704 |
| 6,037,660 | A | * | 3/2000 | Liu ............................. 257/722 |
| 6,273,185 | B1 | | 8/2001 | Lin et al. |
| 6,336,499 | B1 | * | 1/2002 | Liu ............................. 165/80.3 |
| 6,373,700 | B1 | | 4/2002 | Wang |
| 6,386,274 | B1 | * | 5/2002 | Wang et al. ............... 165/80.3 |
| 6,412,546 | B1 | * | 7/2002 | Lin et al. ................... 165/80.3 |
| 6,480,388 | B1 | * | 11/2002 | Lee et al. ................... 361/704 |
| 6,567,269 | B2 | * | 5/2003 | Homer et al. ............... 361/700 |
| 6,976,525 | B2 | * | 12/2005 | Lin ............................. 165/80.3 |
| 7,042,719 | B2 | * | 5/2006 | Lai ............................. 361/687 |
| 7,180,743 | B2 | * | 2/2007 | Chen et al. ................. 361/704 |
| 2003/0159819 | A1 | * | 8/2003 | Lee ............................. 165/185 |
| 2004/0105236 | A1 | | 6/2004 | Lee et al. |

* cited by examiner

*Primary Examiner*—Gregory D Thompson
(74) *Attorney, Agent, or Firm*—Morris Manning Martin LLP; Tim Tingkang Xia, Esq.

(57) ABSTRACT

A locking device for securing a heat sink to a heat generating electronic device includes a retaining member attached to the heat sink and a plurality of fasteners positioned to the retaining member. The retaining member includes a frame and a plurality of fastening feet integrally formed with the frame by metal extrusion. The frame has an opening for receiving a bottom protrusion of the heat sink therein. Each fastening foot has a slot therein communicating with the opening of the frame and defines a fastening hole. The fasteners are respectively positioned in the fastening holes of the fastening feet of the retaining member.

19 Claims, 3 Drawing Sheets

LOCKING DEVICE FOR HEAT SINK

BACKGROUND

1. Field

The present invention relates generally to a locking device, and more particularly to a locking device which can secure a heat sink to a heat generating device.

2. Prior Art

It is widely acknowledged that heat is produced during operation of electronic devices such as central processing units (CPUs). The heat produced must be quickly removed to ensure the CPUs to work normally. Generally, a heat sink is provided to remove heat from the CPU. In order to keep the heat sink intimately contacting with the CPU, a locking device is generally required.

Nowadays, numerous locking devices are used for securing heat sinks to electronic devices. Typically, a locking device comprising a rectangular retention module and a piece of elongated clip is often used. The retention module is located around a CPU on a printed circuit board. A heat sink is brought to rest on the retention module and the CPU. The clip comprises a central pressing portion and a pair of engaging portions extending perpendicularly from the pressing portion. The retention module has corresponding engaging members thereof for engaging with the engaging portions of the clip. In assembly, the pressing portion rests on the heat sink and presses the heat sink toward the CPU so that the heat sink and the CPU can have an intimate contact with each other. The engaging portions of the clip are engaged with the engaging members of the retention module. Thus, the heat sink is secured to the CPU. However, with the development of computer industry, more and more electronic components need to be arranged on the printed circuit board, which results that there is no sufficient space around the CPU to accommodate the retention module. Therefore, the locking device as mentioned above no longer can be used.

In order to overcome the problem set forth above, a locking device frugally occupying space arises to secure a heat sink to a CPU. The locking device comprises two retaining frames and four fasteners. Each retaining frame, substantially a C-shaped strip, is formed by stamping a metal plate, and has two retaining feet at two ends thereof respectively. The retaining frames are respectively fixed to two opposite sides of a base of the heat sink via several screws, and have the retaining feet extending away from the base. Then the heat sink is fixed to the printed circuit board via the fasteners engaging in fixing holes defined in the retaining feet of the retaining frames and fixing apertures defined in a fixture attached to a bottom face of the printed circuit board. However, due to the stamping process, considerable amount of scrap metal is produced for forming the retaining frames. Therefore, the cost of the retaining frames is considerably high.

SUMMARY

Accordingly, what is needed is a locking device which has a low manufacturing cost, since during formation of the locking device there is no large amount of scraps to be produced.

A locking device in accordance with a preferred embodiment of the present invention is for securing a heat sink to a heat generating electronic device. The heat sink comprises a base having a bottom protrusion for contacting with and absorbing heat from the electronic device. The locking device comprises a retaining member attached to the heat sink and a plurality of fasteners positioned to the retaining member. The retaining member is integrally formed by metal extrusion. The retaining member comprises a frame and a plurality of fastening feet integral with the frame. The frame has an opening for receiving the protrusion of the heat sink therein. Each fastening foot has a slot therein communicating with the opening of the frame and defines a fastening hole at an end of the slot. The fasteners are respectively positioned in the fastening holes of the fastening feet of the retaining member.

Other advantages and novel features of the present invention will become more apparent from the following detailed description when taken in conjunction with the accompanying drawings, in which:

DETAILED DESCRIPTION OF THE EMBODIMENT

Figure 1:
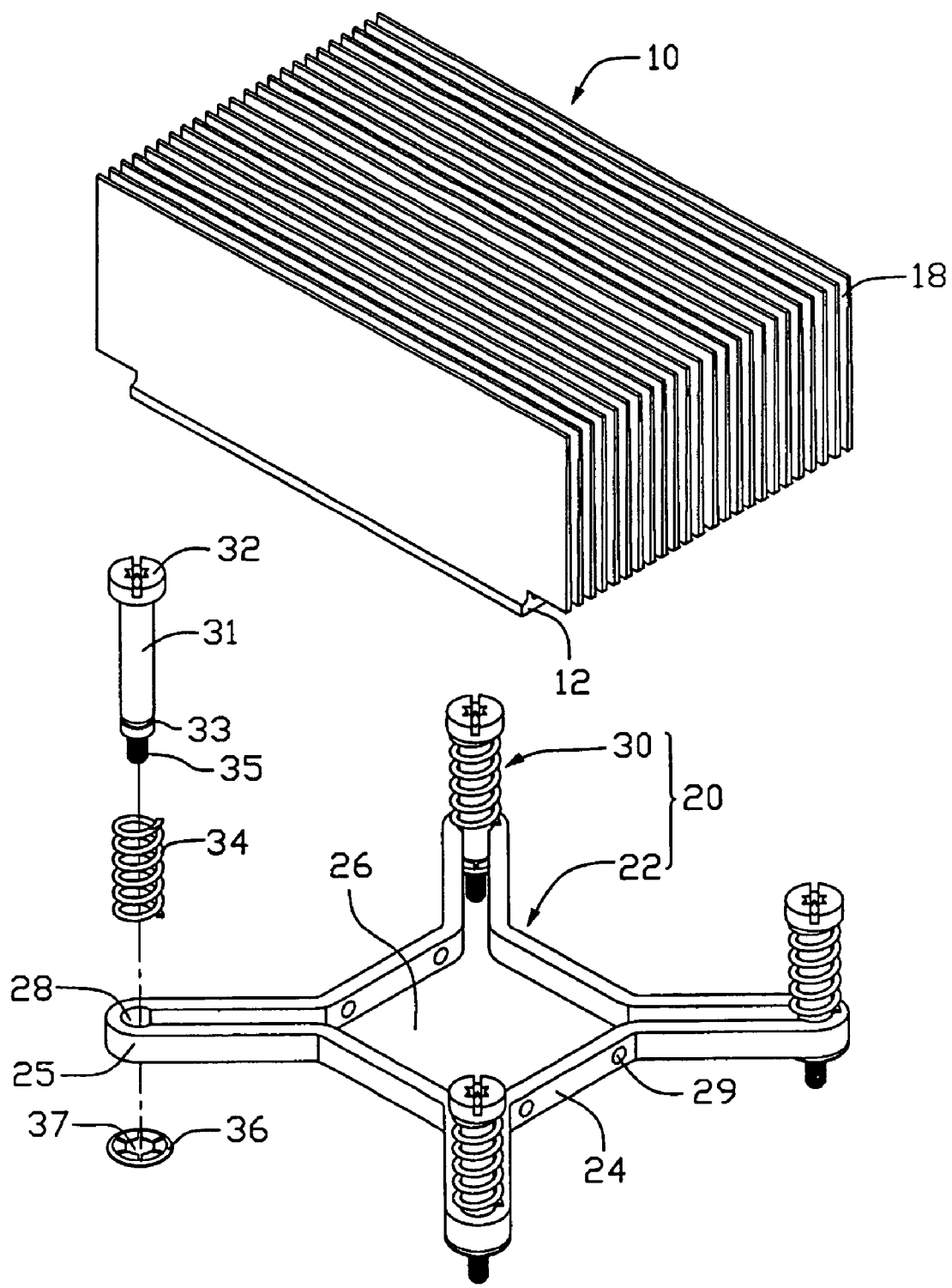
FIG. 1 is an exploded, isometric view of a locking device according to a preferred embodiment of the present invention for securing a heat sink to a heat generating electronic component.

Reference will now be made to the drawing figures to describe the present invention in detail.

FIG. 1 illustrates a locking device 20 according to a preferred embodiment of the present invention, for securing a heat sink 10 to a heat generating electronic component such as a CPU (not shown) mounted on a printed circuit board (not shown).

Figure 2:
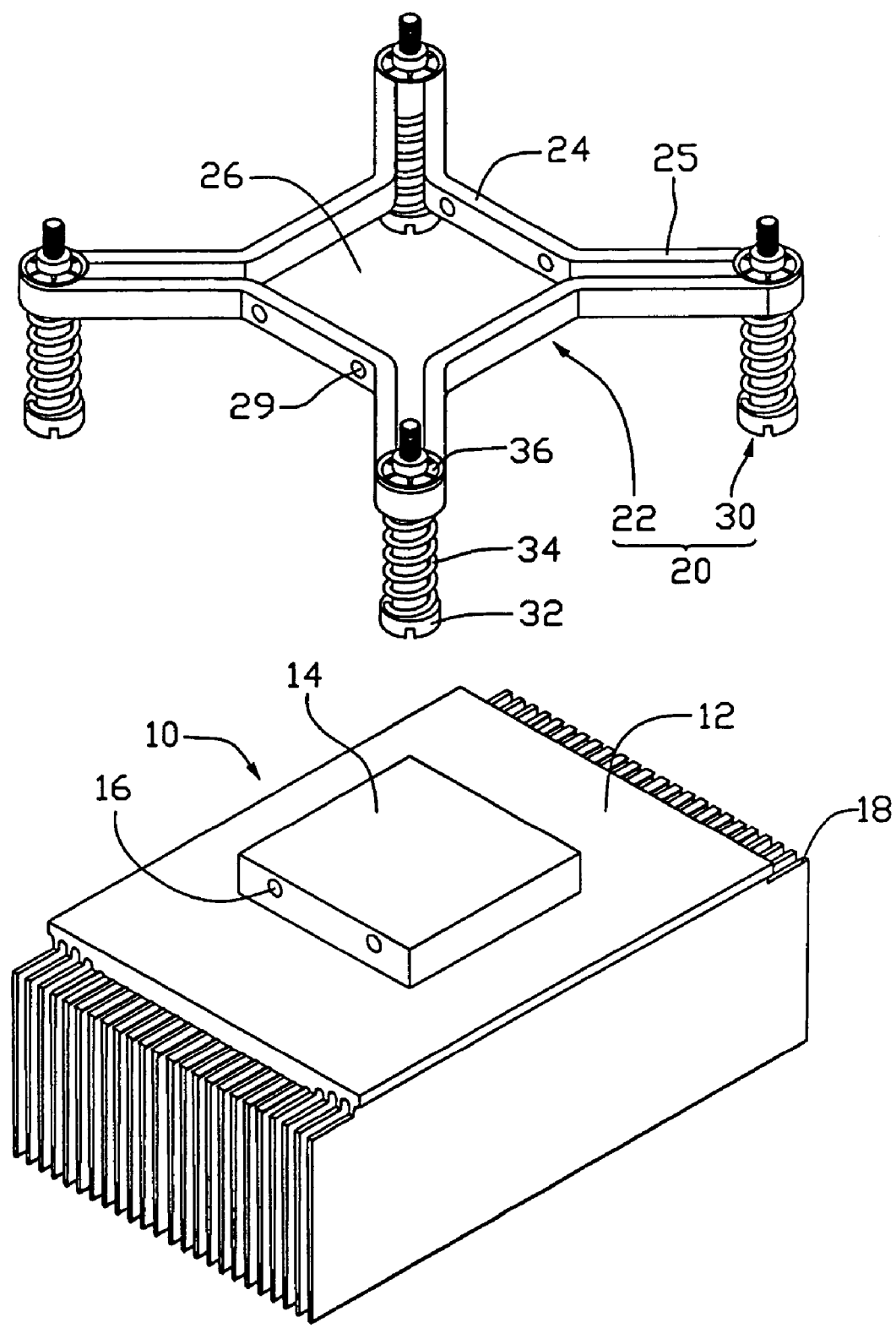
FIG. 2 is an inverted, partially assembled view of FIG. 1.

Also referring to FIG. 2, the heat sink 10 comprises base 12 and a plurality of fins 18 extending upwardly from a top face of the base 12. Opposite to the fins 18, the base 12 has a protrusion 14 extending downwardly from a center of a bottom face thereof. The protrusion 14 is substantially rectangular in shape and defines two fixing hole 16 in each of two opposite sides thereof for fixing the locking device 20 thereto.

The locking device 20 comprises a hollow retaining member 22 and four fasteners 30. The retaining member 22 is integrally formed by metal extrusion, for example, aluminum extrusion, and has a rectangular frame 24 and four fastening feet 25 extending from four corners of the frame 24. The frame 24 has an opening 26 in a center thereof for receiving the protrusion 14 of the heat sink 10 therein. In this case, the opening 26 is rectangular in shape, it is apparent that the opening 26 can be in other shapes according to shapes of the protrusion 14 of the heat sink 10, such as round in shape. Each of two opposite sides of the frame 24 defines two fixing apertures 29 corresponding to the fixing holes 16 of the heat sink 10 for fixing the retaining member 22 to the heat sink 10. The opening 26 of the frame 24 communicates with a slot (not labeled) in each fastening foot 25. The slot has an end distant from the opening 26, which is expanded to form a fastening hole 28 at an end of the fastening foot 25 for locating the fastener 30 thereat. Each fastener 30 comprises a bolt 31, a helical spring 34 and a securing piece 36 for securing the fastener 30 to the retaining member 22. The bolt 31 has an expanding head 32 at a top end thereof, a thread portion 35 at a bottom end thereof, and a circular groove 33 at a circumference of the bolt 31 above the thread portion 35. The securing piece 36 defines a through aperture 37 in a center thereof, and a plurality of radial slots (not labeled) around the aperture 37 and communicating with the aperture 37 for enhancing flexibility of the securing piece 36 to facilitate the securing piece 36 to be combined to the groove 33 of the bolt 31.

Figure 3:
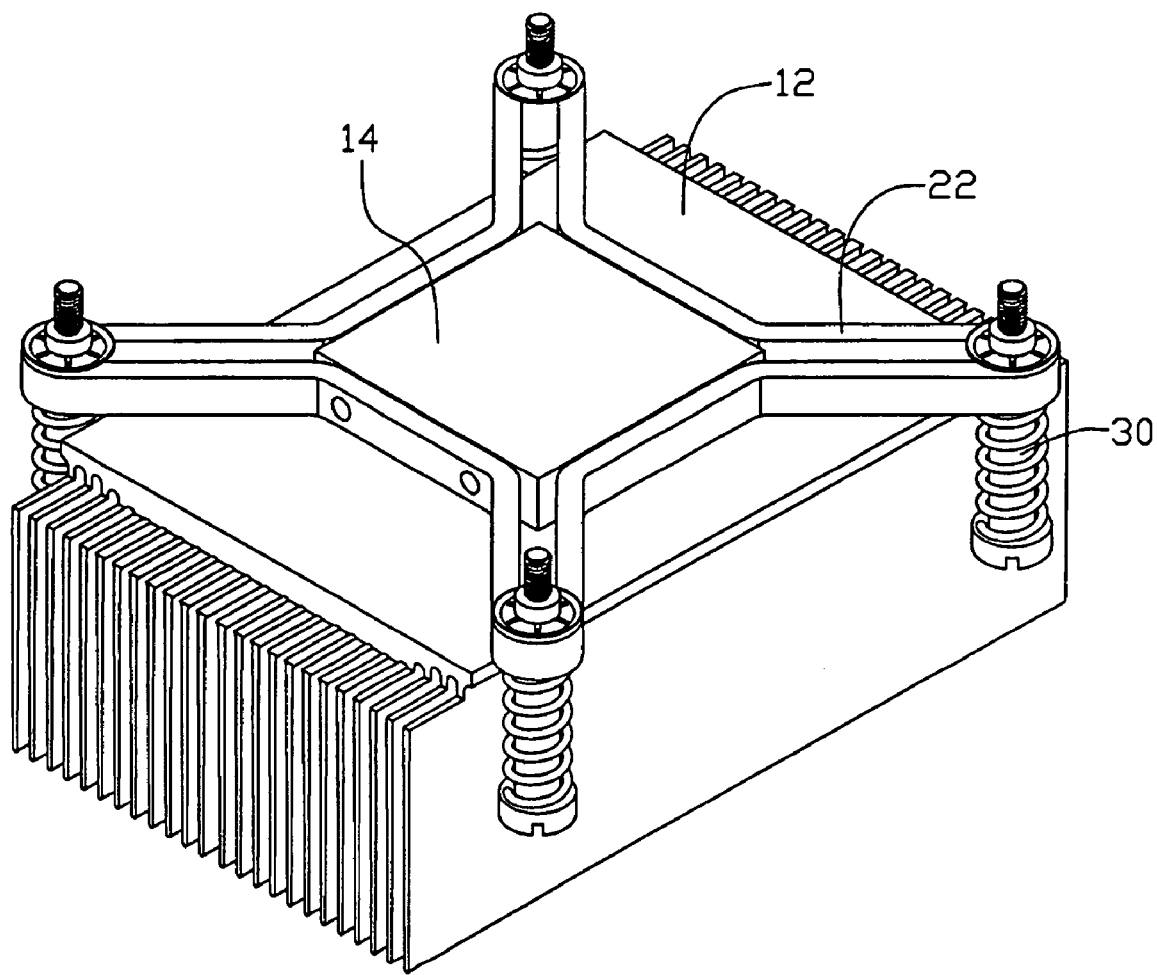
FIG. 3 is an assembled view of FIG. 2.

Also referring to FIG. 3, in assembly, the bolts 31 of the fasteners 30 with the helical spring 34 combined thereto are inserted into the fastening holes 28 of the retaining member 22 with the thread portions 35 and the grooves 33 extending downwardly beyond the fastening holes 28. The securing pieces 36 are respectively combined to the grooves 33 of the bolts 31 and abut against bottoms of the fastening feet 25. Therefore, the fasteners 30 are retained to the retaining member 22. The protrusion 14 of the heat sink 10 is received in the opening 26 of the retaining member 22. The retaining member 22 is fixed to the heat sink 1 via a plurality of fixing members (not shown) such as screws fixed into the fixing apertures 29 of the retaining member 22 and the fixing holes 16 of the heat sink 10. Thus, the locking device 20 consisting of the retaining member 22 and the fasteners 30 is attached to the heat sink 10.

In use, the protrusion 14 of the heat sink 10 contacts the heat generating electronic component. The thread portions 35 of the bolts 31 of the fasteners 30 are engaged in four screwed holes defined in four posts of a fixture (not shown) attached to a bottom face of the printed circuit board (no shown). Since the fixture is well known to persons skilled in the art, it is not described in details here. Thus, the heat sink 10 is intimately secured to the heat generating electronic component.

According to the preferred embodiment of the present invention, the retaining member 22 of the locking device 20 is integrally formed by metal extrusion, whereby no large amount of scraps is produced during the formation of the retaining member 22. Therefore, cost of the locking device 2 is considerably lowered in comparison with the conventional locking device. Although in the preferred embodiment, the retaining member 22 is formed by metal extrusion, it is well known to persons skilled in the art that the retaining member 22 can be formed by other methods of integral formation without producing substantial scraps, such as plastics injection or metal power sintering or metal forging.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A locking device for a heat sink comprising:
   a retaining member having an opening defined in a center thereof for receiving the heat sink therein and a plurality of fastening feet at a periphery of the opening, the opening extending through the fastening feet and defining a fastening hole in each of the fastening feet; and
   a plurality of fasteners respectively positioned in the fastening holes of the fastening feet of the retaining member.

2. The locking device of claim 1, wherein the fastening hole is in an end of each of the fastening feet distant from the center of the retaining member.

3. The locking device of claim 1, wherein each of the fasteners comprises a bolt having a head at one end thereof and a thread portion at opposite end thereof, and a spring combining to the bolt under the head.

4. The locking device of claim 3, wherein the bolt of each of the fasteners defines a circumferential groove above the thread portion of the bolt, and wherein each of the fasteners further comprises a securing piece combined to the groove of the bolt.

5. The locking device of claim 4, wherein the securing piece of each of the fasteners defines a through aperture in a center thereof, the bolt being received in the through aperture.

6. The locking device of claim 5, wherein the thread portion and the groove of the bolt extend beyond the fastening hole of the retaining member, and wherein the spring is above the fastening hole opposite to the securing piece.

7. The locking device of claim 5, wherein the securing piece of each of the fasteners defines a plurality of radial slots at a periphery of the through aperture and communicating with the through aperture.

8. A heat dissipation assembly comprising:
   a heat sink comprising a base, the base having a protrusion for absorbing heat;
   a retaining member attached to the heat sink, the retaining member comprising a frame and a plurality of fastening feet integral with the frame, the frame having an opening receiving the protrusion of the heat sink therein, each fastening foot having a slot therein communicating with the opening of the frame; and
   a plurality of fasteners respectively positioned in the slots of the fastening feet of the retaining member;
   wherein each of the slots of the fastening feet of the retaining member has an expanded fastening hole, the fasteners being positioned in the fastening holes of the fastening feet, respectively.

9. The heat dissipation assembly of claim 8, wherein each of the slots extends to an end of each of the fastening feet.

10. The heat dissipation assembly of claim 8, wherein the protrusion of the base of the heat sink defines at least one fixing hole at a side of two opposite sides thereof, and wherein the frame of the retaining member defines at least one fixing aperture in alignment with the fixing hole for fixing the retaining member to the protrusion of the base of the heat sink.

11. The heat dissipation assembly of claim 8, wherein each of the fasteners comprises a bolt having a head at one end thereof and a thread portion at an opposite end thereof, and a spring combined to the bolt under the head.

12. The heat dissipation assembly of claim 11, wherein the bolt of each of the fasteners defines a circumferential groove above the thread portion of the bolt, and wherein each of the fasteners further comprises a securing piece combined to the groove of the bolt.

13. The heat dissipation assembly of claim 12, wherein the thread portion and the groove of the bolt extend downwardly beyond the fastening hole of the retaining member, and wherein the spring is above the fastening hole opposite to the securing piece.

14. The heat dissipation assembly of claim 8, wherein the heat sink has a plurality of fins extending from the base opposite to the protrusion.

15. A heat sink assembly for a heat generating electronic component, comprising:
   a heat sink having a bottom protrusion and a plurality of top fins;
   a retaining member having integrally formed frame and fastening feet extending outwardly from the frame, said frame being secured with the protrusion, and said fastening feet each defining a hole therein; and a plurality of fasteners respectively received in the holes of the fastening feet, each fastener including a bolt having a top head and bottom threaded portion, a spring combined to the bolt and located between the head and a corresponding fastening foot, the threaded portion being located below the corresponding fastening foot.

16. The heat sink assembly of claim 15, wherein the retaining member has a central opening fittingly receiving the protrusion of the heat sink.

17. The heat sink assembly of claim 16, wherein a slot is defined in each of the fastening feet, and said slot communicates the central opening with a corresponding hole.

18. The heat sink assembly of claim 17, wherein the protrusion is for contacting and absorbing heat of the heat generating electronic component.

19. The heat sink assembly of claim 18, wherein each of the bolts further has a groove in a circumference thereof, and each of the fasteners further comprises a securing piece combined to a corresponding groove at a position below a corresponding fastening foot, the securing piece abutting against a bottom of the corresponding fastening foot.

* * * * *